United States Patent [19]

Tattersall

[11] 4,203,009
[45] May 13, 1980

[54] UNBALANCED/BALANCED CONVERTER CIRCUITS

[75] Inventor: Graham D. Tattersall, Kirkkonammi, Finland

[73] Assignee: The Post Office, London, England

[21] Appl. No.: 932,696

[22] Filed: Aug. 10, 1978

[30] Foreign Application Priority Data

Aug. 17, 1977 [GB] United Kingdom ............... 34510/77

[51] Int. Cl.² ........................................... H04M 19/06
[52] U.S. Cl. ............................ 179/16 AA; 179/18 FA; 179/70
[58] Field of Search ........... 179/70, 77, 170 R, 170 T, 179/170 NC, 16 AA, 18 FA, 81 R

[56] References Cited

U.S. PATENT DOCUMENTS

| | | | |
|---|---|---|---|
| 3,886,322 | 5/1975 | Colardelle et al. | 179/170 NC |
| 4,007,335 | 2/1977 | Hetherington et al. | 179/16 AA |
| 4,041,252 | 8/1977 | Cowden | 179/170 NC |
| 4,086,447 | 4/1978 | Schindler et al. | 179/170 NC |
| 4,087,647 | 5/1978 | Embree et al. | 179/77 |

FOREIGN PATENT DOCUMENTS 2254168  7/1975  France .................................... 179/77

Primary Examiner—Bernard Konick
Assistant Examiner—Randall P. Myers
Attorney, Agent, or Firm—Mason, Fenwick & Lawrence

[57] ABSTRACT

A balanced/unbalanced converter circuit for connection to a subscriber's telephone line. A first Darlington transistor pair is connected as a controllable impedance between a first supply terminal and a first balanced input/output terminal. A second Darlington transistor pair is likewise connected between a second supply terminal and a second balanced terminal. A potential-summing resistive network is connected between the balanced terminals and the sum-representative potential is compared with a reference to provide a control signal to simultaneously change the impedances in opposite directions to correct any departure from balance. A third transistor controllable impedance circuit is connected in series with one Darlington transistor pair and used to regulate direct current flow through the line.

14 Claims, 2 Drawing Figures

UNBALANCED/BALANCED CONVERTER CIRCUITS

This invention relates to circuits for connection between a balanced network and an unbalanced network to transfer signals back and forth between the balanced and unbalanced networks.

In the British Standards Institution "Glossary of Terms Used in Telecommunication and Electronics" B.S. 204: 1960 a balanced transmission line is defined as "A transmission line which is balanced electrically to earth and/or other conductors". The currently employed two-wire subscriber's telephone line is an example of a balanced transmission line although the potentials of the two wires are not symmetrically arranged with respect to earth potential since one pole of a central battery in an exchange to which the line is connected is earthed according to standard practice. It is not usual to include a power supply in the subscriber's telephone instrument and the central battery system is the standard way of supplying electrical power to telephone instruments. Thus, the standard two-wire subscriber's telephone line functions both as a means of feeding current to the associated telephone instrument to supply it with electrical power and as a balanced transmission line for transferring speech signals to and from the exchange.

In recent years, it has been proposed to transmit speech data between telephone exchanges in a pulse-coded digital form. For coding in a digital form, it is convenient to use speech signals which are not electrically balanced and therefore there is a need to have a circuit which can be used to derive both a balanced output signal from an unbalanced input signal and an unbalanced output signal from a balanced input signal. This function can be achieved by a transformer but transformers have the disadvantage of being both bulky and expensive. Balanced active 2:4 wire converter circuits are known but generally require close matching of component values to maintain a properly balanced system.

It is an object of the invention to provide an improved circuit for connection between a balanced network and an unbalanced network.

The present invention provides a circuit for connection between a network balanced to earth or other potential and an unbalanced network to transfer signals back and forth between the two networks, the circuit comprising:

first and second supply terminals for connection to respective poles of an electrical supply, first and second balanced input/output terminals for connection to a balanced network, first and second unbalanced input/output terminals for connection to an unbalanced network, a first circuit of controllable impedance connected between the first supply terminal and the first balanced input/output terminal, a second circuit of controllable impedance connected between the second supply terminal and the second balanced input/output terminal, and a control circuit connected to monitor any departure from balance of the potentials of the first and second balanced input/output terminals and to simultaneously change the impedances of the first and second circuits of controllable impedance in opposite directions to restore the potentials to balance, the first unbalanced input/output terminal being connected to one or other of the balanced input/output terminals and the second unbalanced input/output terminal being connected to a common point.

The control circuit and the first and second circuits of controllable impedance can be arranged to respond to frequencies embracing both dc. (direct current) and audio frequencies.

A further circuit of controllable impedance, but arranged to respond solely to d.c. and very low frequencies can be connected in series with one or other of the first and second circuits of controllable impedance and be arranged to regulate the direct current flowing from a d.c. power supply connected, in use, to the supply terminals and through a balanced network connected to the balanced input/output terminals. The further circuit of controllable impedance provides d.c. centralisation of the first and second circuits of controllable impedance and acts to attenuate noise on the supply terminals. This arrangement is of particular value in a telephone system as it can provide both regulated current line feed and balanced/unbalanced line conversion.

The control circuit can comprise a resistive network arranged to produce a potential representative of the sum of the potentials of the first and second balanced terminals and comparison means to compare the sum-representative potential with a reference potential.

The resistive network can comprise first and second resistors connected from one to the other of the first and second balanced input/output terminals and a third resistor connected from the junction of the first and second resistor to a point of fixed potential, the comparison means being connected to compare the potential at the said junction with the reference potential.

The comparison means can comprise a differential amplifier having one input connected to receive the sum-representative potential and its other input connected to a source of the reference potential.

Further comparison means can be connected to compare the output of the first-mentioned comparison means with a reference potential and can have an output connected to control the further circuit of controllable impedance. The source of reference potential can be common to both comparison means.

The further comparison means can comprise a differential amplifier having one input connected to the output of the first-mentioned comparison means and its other input connected to a or the source of the reference potential.

The first and second circuits of controllable impedance can comprise first and second transistors respectively, each transistor having its collector-emitter path connected between a respective one of the supply terminals and the associated balanced input/output terminal. The transistors can be of complementary conductivity type. Each transistor can have its base connected to the emitter of a respective further transistor and its collector connected to the collector of the respective further transistor to define a Darlington transistor pair.

The further circuit of controllable impedance can comprise a transistor having its collector-emitter path connected in series with one or other of the first and second circuits of controllable impedance.

The first and second balanced input/output terminals can be connected respectively to the A-leg and B-leg of a subscriber's telephone line.

By way of example only, an illustrative embodiment of the invention will now be described with reference to the accompanying drawings, in which.

Figure 1:
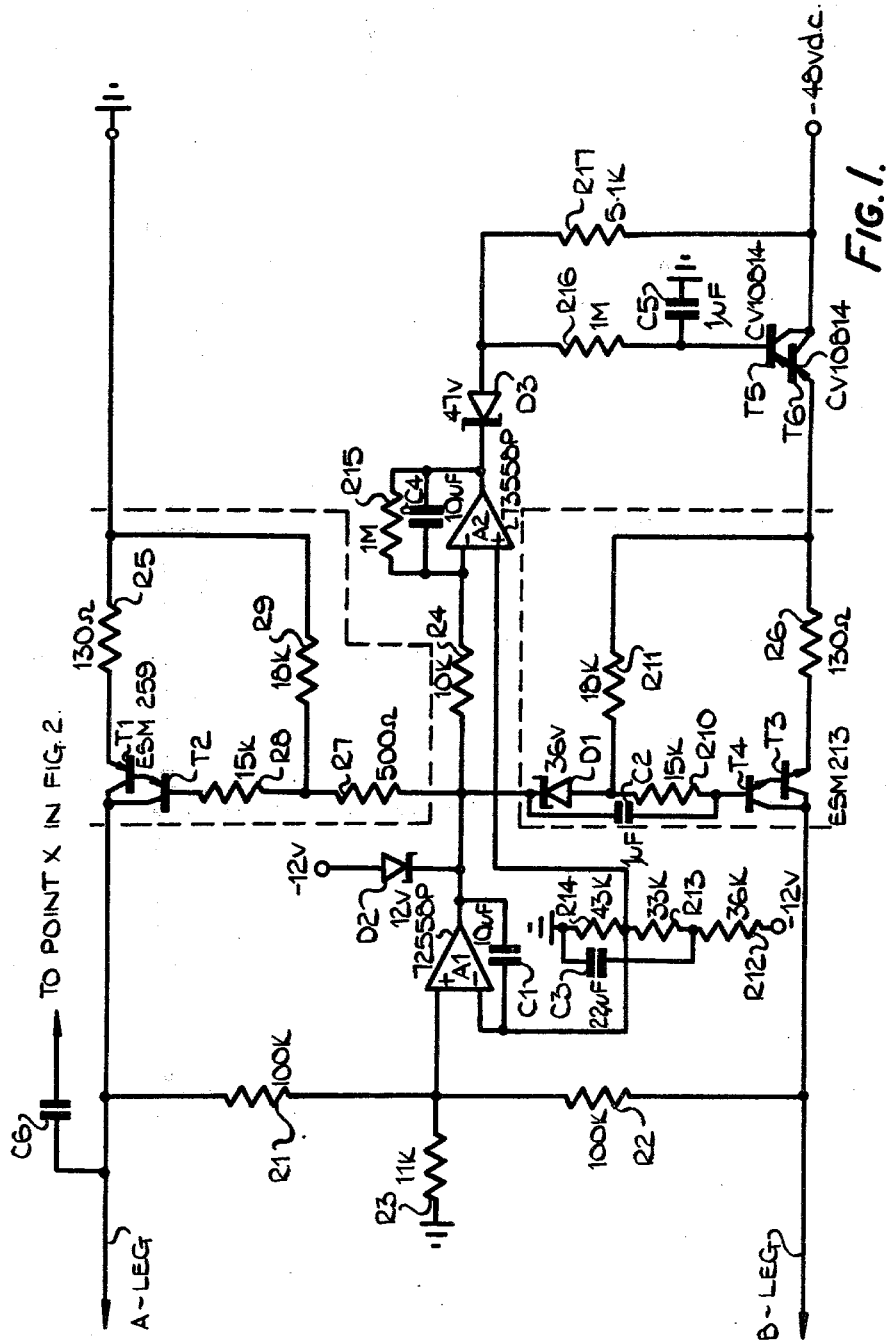
FIG. 1 shows a line feed circuit embodying the invention.

The circuits shown are to be assumed to be located in a digital telephone exchange for example a digital PABX (private automatic branch exchange). Referring to FIG. 1, the two wires connected to one telephone instrument served by the exchange are referenced A-leg and B-leg using the terminology common in telephone engineering. Two 1% 100 kilohm resistors R1 and R2 are connected in series from the A-leg to the B-leg. The junction of resistors R1 and R2 is connected to earth through a 1% 11 kilohm resistor R3 and also to the non-inverting input of a type 72558P amplifier A1. The output of amplifier A1 is fed back to its inverting input through a 10 picofarad capacitor C1 and is connected to the inverting input of another type 72558P amplifier A2 through a 10 kilohm resistor R4.

The A-leg is also connected to the collector of a PNP transistor T1, the emitter of which is connected to earth through a 1% 130 ohm resistor R5. The collector of another PNP transistor T2 is connected to the collector of transistor T1 and the base of transistor T1 is connected to the emitter of transistor T2. Transistors T1 and T2 form a Darlington pair and are type ESM 259 available from Thompson CSF.

The B-leg is also connected to the collector of an NPN transistor T3, the emitter of which is connected to one end of a 1% 130 ohm resistor R6. The collector of another NPN transistor T4 is connected to the collector of transistor T3 and the base of transistor T3 is connected to the emitter of transistor T4. Transistors T3 and T4 form a Darlington pair and are type ESM 213 available from Thompson CSF.

The output of amplifier A1 is connected to one end of a 500 ohm resistor R7, the other end of which is connected through a 15 kilohm resistor R8 to the base of transistor T2. An 18 kilohm resistor R9 is connected to earth from the junction of resistors R7 and R8.

The output of amplifier A1 is also connected to the cathode of a 36 volt ± 5% zener diode D1, the anode of which is connected to one end of another 15 kilohm resistor R10, and to the cathode of a 12 volt zener diode D2, the anode of which is connected to a −12 volts supply. The other end of resistor R10 is connected to the base of transistor T4. A 1 microfarad capacitor C2 is connected from the cathode of zener diode D1 to the base of transistor T4. Another 18 kilohm resistor R11 is connected from the junction of zener diode D1 and resistor R10 to the end of resistor R6 remote from transistor T3.

A 36 kilohm resistor R12 has one end connected to a −12 volts supply and its other end connected to one end of a 33 kilohm resistor R13. The other end of resistor R13 is connected to earth through a 43 kilohm resistor R14. A 22 microfarad capacitor C3 is connected from the junction of resistors R12 and R13 to earth. The inverting input of amplifier A1 is connected to the junction of resistors R13 and R14. The non-inverting input of amplifier A2 is also connected to the junction of resistors R13 and R14.

The output of amplifier A2 is fed back to its inverting input through the parallel combination of a 1 megohm resistor and a 10 microfarad capacitor C4. The output of amplifier A2 is also connected to the cathode of a 47 volt ± 5% zener diode D3, the anode of which is connected through a 1 megohm resistor R16 to the base of a PNP transistor T5. The emitter of transistor T5 is connected to the base of another PNP transistor T6, the collectors of transistors T5 and T6 being commonly connected. The emitter of transistor T6 is connected to the end of resistor R6 remote from transistor T3. Both transistors T5 and T6 are type CV10814. 1 microfarad capacitor C5 is connected to earth from the base of transistor T5. A 5.1 kilohm resistor R 17 is connected from the anode of zener diode D3 to the collectors of transistors T5 and T6. The collectors of transistors T5 and T6 are connected to a −48 volts supply.

Figure 2:
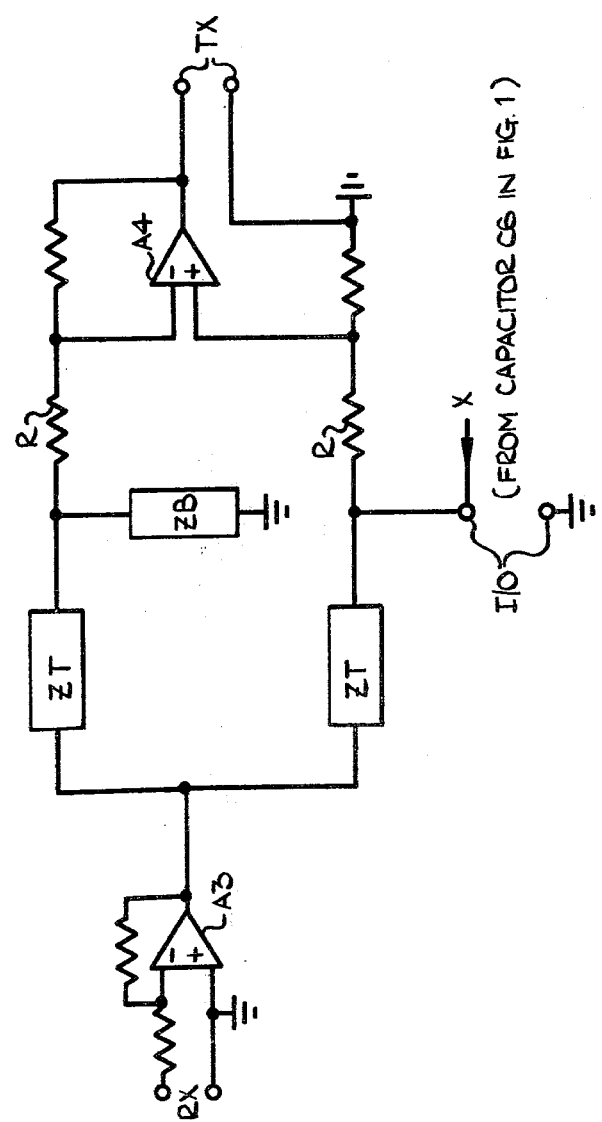
FIG. 2 shows the circuit of a 2:4 wire converter for use with the line feed circuit of FIG. 1.

One end of a capacitor C6 is connected to the A leg and its other end is connected to a point X in the circuit of FIG. 2.

The circuit shown in FIG. 2 is a 2:4 wire converter for providing an interface between a pair of input/output terminals (signal and earth, the "2 wires") and a pair of transmitting terminals (signal and earth, two of the "4 wires") and a pair of receiving terminals (signal and earth, the other two of the "4 wires"). The construction of 2:4 wire converters is well known to those skilled in the art and therefore the description of FIG. 2 will be made brief.

The input/output terminals of the converter are referenced I/O, the transmitting terminals TX and the receiving terminals RX. The receiving terminals RX are connected through an amplifier A3 to the junction of two equal exchange terminating impedances ZT. One of the impedances ZT has its other end connected to the input/output terminals connected to capacitor C6 and to one end of a resistor of resistance R. The other end of the other impedance ZT has its other end connected to another resistor of resistance R and to one end of a 2:4 wire balancing impedance ZB. The other end of impedance ZB is connected to earth. The other ends of the resistors of resistance R are connected through an amplifier A4 to the transmitting terminals TX. The impedance ZB is equal to one quarter the line impedance and R is high (typically 100 kilohm) compared with both ZT and ZB. The circuit of FIG. 2 will not be described in further detail because it is a circuit of known type and included merely to show the use made of the circuit of FIG. 1.

The operation and use of the circuit of FIG. 1 will now be described.

The network consisting of resistors R12, R13 and R14 defines a reference potential applied to the inverting input of amplifier A1 and to the non-inverting input of amplifier A2. Amplifier A1 provides an output signal consisting of the amplified difference in potential between the potential at the junction of the resistors R1 and R2 and the reference potential. Amplifier A2 provides an output signal consisting of the amplified difference in potential between the reference potential and the output signal of amplifier A1. The output signal of amplifier A1 controls the Darlington pairs T1, T2 and T3, T4, a negative-going signal lowering the impedance of the collector-emitter path of transistor T1 and raising that of transistor T2 and vice versa for a positive-going signal. The amplifier A1 will produce a negative-going output signal if the potential at the junction of the resistors R1 and R2 becomes more negative but the effect of the impedance of transistor T1 falling and that of T2 rising is to make the junction potential less negative.

Thus, the potential at the junction of resistors R1 and R2 tends to a value equal to the reference potential.

The output of amplifier A2 controls the collector-emitter impedance of transistor T6, a positive-going output signal raising the impedance and a negative-going signal lowering it. Such a positive-going signal will arise from the potential at the junction of resistors R1 and R2 becoming more negative and thus the overall effect is again to cause the junction potential to tend to a value equal to the reference potential.

The resistors R1, R2 and R3 are chosen so that when the junction potential is equal to the reference potential, the mean of the potential of the A- and B- legs is equal to one half of the supply voltage, that is −24 volts. Furthermore, the component values and parameters are such that the loop current through the A- and B- legs is equal to 25 milliamps when the junction potential equals the reference potential. The voltage output from amplifier A1 applied via components R7, R8 and D1, R10 (acting as biassing chains) to the Darlington transistors T1, T2 and T3, T4 are primarily responsible for setting the current level in conjunction with the emitter resistors R5 and R6. Amplifier A1 and transistors T1, T2, T3 and T4 have a good response to audio frequencies and d.c. Amplifier A2 and transistors T5 and T6 driven via components D3 and R16 (acting as a biassing chain) centralise the first two circuits of controllable impedance (T1, T2; T3, T4) to ensure equal voltage drops from the A-leg output to earth and from the B-leg output to −48 volts. The components R15, C4, R16 and C5 severely curtail the frequency response of amplifier A2 and transistors T5 and T6 so that they respond solely to d.c. and very low frequencies.

It has already been explained that the circuit tends to maintain the potential at the junction of resistors R1 and R2 constant and it can be seen that a signal voltage applied between the A-leg (say) and earth will disturb the junction potential. The circuit will react to such a signal voltage by attempting to restore the junction potential to the value of the reference potential. If the signal voltage is a signal of audio frequency, the transistor T6 will not respond by virtue of the very limited frequency response associated with it but the impedance of one of the transistors T1, T3 will rise while that of the other falls to restore the junction potential to the reference potential. Thus, if a positive going potential is applied to the A-leg the circuit will react by making the A-leg less positive and the B-leg more positive until the mean potential of A- and B- legs is once more −24 volts. The effect is that a signal applied to the A-leg with respect to earth becomes, through the operation of the circuit, a differential signal on the A- and B- legs.

The circuits of FIG. 1 provides a dual function of supplying a regulated direct current to the telephone line and also of transferring signals back and forth between the unbalanced converter circuit and the balanced subscriber's line. It has an impedance scaling property in that the A-leg to B-leg line impedance when seen from the point X appears to be multiplied by a factor ¼.

An advantage of regulating the current fed to subscriber's lines is that the peak power supply requirements of an exchange can be substantially reduced because the maximum current to be supplied is known with more certainty than is the case with unregulated line feed circuits. A further advantage is that the loudness regulators in the telephone instruments are not brought into operation which helps to keep the apparent source and load impedances of the telephone instruments constant. Loudness regulators are attenuators contained in telephone instruments which are brought into operation when the energising current is above a threshold value. Even with the regulator disabled the telephone impedance is still dependent upon line feeding current but the present circuit is designed to supply a regulated 25 milliamps to a 1400 ohm loop. This current is below the threshold commonly used for loudness regulators. It is important to know the line and telephone instrument impedance accurately when using a 2:4 wire converter circuit in a digital switching system as otherwise side tone performance can be impaired. Line and telephone instrument impedance can be determined more accurately with the present circuit because the loudness regulators are prevented from operating and the telephone instrument is driven with a constant current. Where loudness regulation is still desired to compensate for different line lengths it can be accomplished in the four-wire part of the circuit in the exchange.

It is possible to omit amplifier A2, transistors T5, T6 and associated components and the circuit of FIG. 1 will continue to function as a converter between balanced and unbalanced signals but at a loss of some degree of control over the centralisation of circuit operation and rejection of noise on the −48 volt supply line.

I claim:

1. A circuit for converting signals balanced to earth or another potential to unbalanced signals and for converting unbalanced signals to signals balanced to earth or another potential, the circuit comprising:
   first and second supply terminals for connection to respective poles of an electrical supply,
   a balanced network having first and second balanced input/output terminals,
   an unbalanced network having first and second unbalanced input/output terminals,
   a first circuit of controllable impedance connected between the first supply terminal and the first balanced input/output terminal,
   a second circuit of controllable impedance connected between the second supply terminal and the second balanced input/output terminal, and
   a control circuit connected to monitor any departure from balance of the potentials of the first and second balanced input/output terminals and to simultaneously change the impedances of the first and second circuits of controllable impedance in opposite directions to restore the potentials to balance, the first unbalanced input/output terminal being connected to a terminal selected from the group consisting of one and the other of the balanced input/output terminals and the second unbalanced input/output terminal being connected to a source of common potential.

2. A circuit as set forth in claim 1, wherein the control circuit and the first and second circuits of controllable impedance are responsive to frequencies including both d.c. (direct current) and audio frequencies.

3. A circuit as set forth in claim 2, wherein a further circuit of controllable impedance, but arranged to respond solely to d.c. and very low frequencies, is connected in series with one or other of the first and second circuits of controllable impedance to regulate the direct current flowing from a d.c. power supply connected to the supply terminals and through a balanced network connected to the balanced input/output terminals.

4. A circuit as set forth in claim 1, wherein said control circuit comprises a potential-summing resistive network connected to sum the potential of the first and second balanced terminals and comparison means to compare the sum-representative potential with a reference potential.

5. A circuit as set forth in claim 4, wherein said resistive network comprises first and second resistors connected from one to the other of the first and second balanced input/output terminals and a third resistor connected from the junction of the first and second resistor to a point of fixed potential, the comparison means being connected to compare the potential at the said junction with said reference potential.

6. A circuit as set forth in claim 5, wherein said comparison means comprises a differential amplifier having one input connected to receive the sumrepresentative potential and its other input connected to a source of said reference potential.

7. A circuit as set forth in claim 1, wherein said first and second circuits of controllable impedance comprise at least one first and at least one second transistor respectively.

8. A circuit as set forth in claim 7, wherein said transistors are of complementary conductivity type.

9. A circuit as set forth in claim 7, wherein each transistor has its base connected to the emitter of a respective further transistor and its collector connected to the collector of the respective further transistor to define a Darlington transistor pair.

10. A circuit as set forth in claim 1, wherein said first and second balanced input/output terminals can be connected respectively to the A-leg and B-leg of a subscriber's telephone line.

11. A circuit for converting signals balanced to earth or another potential to unbalanced signals and for converting unbalanced signals to signals balanced to earth or another potential, the circuit comprising:
   first and second supply terminals for connection to respective poles of an electrical supply,
   a balanced network having first and second balanced input/output terminals,
   an unbalanced network having first and second unbalanced input/output terminals,
   a first circuit of controllable impedance connected between the first supply terminal and the first balanced input/output terminal,
   a second circuit of controllable impedance connected between the second supply terminal and the second balanced input/output terminal, and
   a control circuit connected to monitor any departure from balance of the potentials of the first and second balanced input/output terminals and to simultaneously change the impedances of the first and second circuits of controllable impedance in opposite directions to restore the potentials to balance, the first unbalanced input/output terminal being connected to a terminal selected from the group consisting of one and the other of the balanced input/output terminals and the second unbalanced input/output terminal being connected to a source of common potential, said control circuit and the first and second circuits of controllable impedance being responsive to frequencies including both dc. (direct current) and audio frequencies, said control circuit comprising a potential-summing resistive network connected to sum the potential of the first and second balanced terminals and comparison means to compare the sum-representative potential with a reference potential,
   a further circuit of controllable impedance, but arranged to respond solely to d.c. and very low frequencies, connected in series with one or other of the first and second circuits of controllable impedance and arranged to regulate the direct current flowing from a d.c. power supply connected, in use, to the supply terminals and through a balanced network connected to the balanced input/output terminals, and further comparison means connected to compare the output of the first-mentioned comparison means with said reference potential and having an output connected to control the further circuit of controllable impedance.

12. A circuit as set forth in claim 11, wherein the source of reference potential is common to both comparison means.

13. A circuit as set forth in claim 11, wherein said further comparison means comprises a differential amplifier having one input connected to the output of the first-mentioned comparison means and its other input connected to said reference potential.

14. A circuit as set forth in claim 11, wherein said further circuit of controllable impedance comprises a transistor having its collector-emitter path connected in series with a circuit selected from the group consisting of one and the other first and second circuits of controllable impedance.

* * * * *